United States Patent [19]

Mumola

[11] Patent Number: 5,229,872
[45] Date of Patent: Jul. 20, 1993

[54] EXPOSURE DEVICE INCLUDING AN ELECTRICALLY ALIGNED ELECTRONIC MASK FOR MICROPATTERNING

[75] Inventor: Peter B. Mumola, Huntington, Conn.

[73] Assignee: Hughes Aircraft Company, Los Angeles, Calif.

[21] Appl. No.: 822,794

[22] Filed: Jan. 21, 1992

[51] Int. Cl.$^5$ .................... G02F 1/1335; G03F 9/00; G03B 27/72
[52] U.S. Cl. ........................ 359/40; 359/42; 359/48; 437/924; 355/20; 430/22
[58] Field of Search ............... 359/40, 42, 48; 148/DIG. 102, DIG. 104; 437/80, 924; 355/20, 53, 85, 86, 87; 430/22

[56] References Cited

U.S. PATENT DOCUMENTS

| | | | |
|---|---|---|---|
| 4,672,014 | 6/1987 | Joiner et al. | 359/40 |
| 4,734,558 | 3/1988 | Nakano et al. | 359/41 |
| 4,739,373 | 4/1988 | Nishi et al. | 355/53 |
| 4,810,058 | 3/1989 | Sangyoji et al. | 359/40 |
| 4,812,880 | 3/1989 | Ogawa et al. | 430/22 |
| 5,026,145 | 6/1991 | Marui et al. | 359/41 |
| 5,045,419 | 9/1991 | Okumura | 359/40 |
| 5,082,755 | 1/1992 | Liu | 430/22 |
| 5,105,075 | 4/1992 | Ohta et al. | 355/53 |
| 5,160,957 | 11/1992 | Ina et al. | 355/53 |

Primary Examiner—William L. Sikes
Assistant Examiner—Ron Trice
Attorney, Agent, or Firm—Michael W. Sales; Wanda K. Denson-Low

[57] ABSTRACT

An apparatus 10 for micropatterning a photoresist coated surface 12 of a semiconductor wafer 14 includes a computer 50 for controlling an image on a screen 29 of a cathode ray tube (CRT) 30. The CRT screen 29 is optically connected to a liquid crystal light valve (LCLV) 26 by a fiber optic faceplate 28. This connection is such that the computer controlled image on the CRT screen 29 is reproduced on the face 27 of the LCLV 26 as a reflective pattern of this image. An argon-ion laser 16 provides a polarized monochromatic light beam 18 that is reflected from the face 27 of the LCLV 26. This reflected beam 32 is convergently focused by a lens system 36 onto a projected area 37 of the photoresist coated wafer surface 12, thereby exposing the photoresist with an image of the LCLV reflective pattern. A helium-neon laser 38 provides a polarized monochromatic light beam 44 that is convergently focused onto the same projected area 37 of the wafer surface 12. However, the wavelength of the helium-neon provided light beam 44 is such that there is no exposure to the photoresist coated wafer surface 12. The helium-neon light beam is reflected from the projected area 37 of the wafer surface 12 and directed toward an image plane 49 of a charge coupled device (CCD) camera 48. The CCD camera 48 captures an image of the projected area 37 of the wafer surface 12 and a computer 50 digitizes this image. The computer 50 determines the position of the wafer 14 with respect to the projected reflective pattern image, and updates the image on the CRT screen 29 if the projected reflective pattern image is not properly aligned onto the wafer surface 12. Thus, the entire surface 12 of the wafer 14 may be micropatterned by moving the wafer 14 and updating the CRT screen 29 image in accordance with this movement.

24 Claims, 1 Drawing Sheet

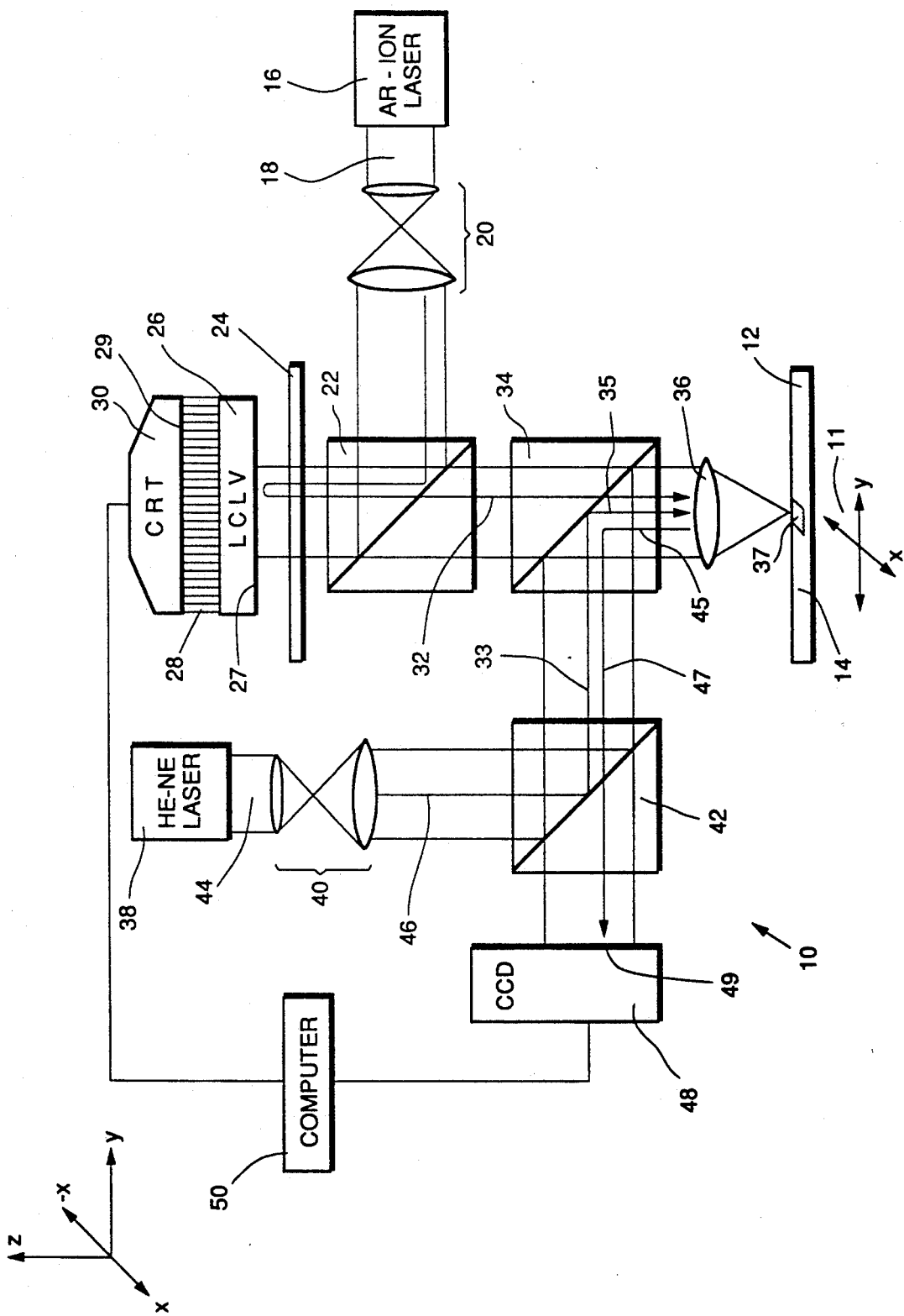

EXPOSURE DEVICE INCLUDING AN ELECTRICALLY ALIGNED ELECTRONIC MASK FOR MICROPATTERNING

BACKGROUND OF THE INVENTION

1. Field of the Invention

The present invention relates to methods for micropatterning a surface of a semiconductor wafer and, more particularly, to a method and an electro-optical apparatus that performs microlithography by electronically generating a mask pattern.

2. Description of the Prior Art

Optical lithography, otherwise known as photolithography, is a process which transfers a pattern of primary electronic or optical elements to a surface of a semiconductor wafer. This process of pattern transfer, or masking, is repeated many times during the fabrication of an integrated electronic circuit or an integrated optical device. During this process, an entire surface of a wafer is coated with a photosensitive emulsion known as photoresist. The photoresist coated wafer surface is then optically exposed in a desired geometric pattern which forms the primary electronic or optical elements. This process, as it is applied to the fabrication of microelectronics and microoptics, is termed microlithography.

Conventional microlithography is generally performed with a projection scheme that utilizes a precise photographic masking plate to project, using a lamp or a laser, a pattern of microelements onto an emulsion treated semiconductor wafer surface. An alignment of the projected mask pattern with fiducial marks or other features on the wafer surface requires a process that detects an alignment error between the projected pattern and the fiducial marks, and subsequently corrects this error. This alignment process is generally performed by an electromechanical actuation system. Such an electromechanical alignment system is a complex and expensive way to achieve overlay registration. Also, a photographic masking plate is expensive and subject to defects and contamination. It is therefore desirable to perform microlithography without an electromechanical alignment system or a photographic masking plate.

SUMMARY OF THE INVENTION

The present invention contemplates an apparatus that micropatterns the surface of a semiconductor wafer with an electronically generated mask pattern that is optically aligned on a surface of the semiconductor wafer. This invention consists of a liquid crystal light valve (LCLV) that is optically connected to a computer driven cathode ray tube (CRT) by a fiber optic face plate. This connection is such that an image on the CRT screen produces a reflective pattern of this image on the face of the LCLV. Hence, as the computer controls the display of a mask pattern on the CRT screen, this mask pattern is reproduced on the face of the LCLV.

A polarized light beam from an argon-ion laser is expanded, collimated, and reflectively directed to the face of the LCLV through a collimator, a first polarizing beam splitter (PBS), and a quarter wave plate (QWP), respectively. A portion of the argon-ion beam is reflected from the mask pattern laden face of the LCLV and returned through the QWP in the proper polarization so as to pass through the first PBS and also through a second PBS. This beam is demagnified through a lens system and an image of the mask pattern is formed on a projected area of a photoresist coated semiconductor wafer surface, thereby exposing the photoresist with a demagnified mask pattern image.

A polarized light beam from a helium-neon laser is expanded and collimated, proportionally reflectively directed, and totally reflectively directed to the surface of the semiconductor wafer through a collimator, a non-polarizing beam splitter (BS), and the second PBS, respectively. This helium-neon light beam is demagnified through the same lens system that also demagnified the argon-ion beam, and thus both of these beams are projected upon the same area of the wafer surface. However, the wavelength of the helium-neon light beam is chosen such that there is no exposure to the photoresist coated wafer surface. Accordingly, this helium-neon beam is used to illuminate the projected surface area of the wafer and to assist in aligning the projected mask pattern image onto the wafer surface. It should be noted that a grid of alignment fiducials are customarily patterned across the entire photoresist coated wafer surface before the microlithography process begins.

The helium-neon light beam is reflected from the wafer surface and reflected and proportionally passed through the second PBS and the BS, respectively, onto an image plane of a charge coupled device (CCD) camera. An image of the projected surface area of the wafer, including alignment fiducials, is formed on this image plane. The CCD camera captures the projected surface area image, and a computer digitizes this captured surface image to determine the present projected surface area position in relation to the entire wafer surface. This computer, which may be the same computer that controls the mask pattern display on the CRT screen, compares the present projected surface area position to a desired or expected position and determines if any alignment errors exist. If an alignment error does exist, the computer updates the mask pattern display on the CRT screen, thereby making a real-time adjustment in the projected mask pattern being exposed onto the photoresist coated wafer surface. This alignment scheme allows full wafer surface area micropatterning by moving the projected argon-ion and helium-neon light beams along the wafer surface and scrolling an electronically generated mask pattern, that may be stored in the computer's memory, along with this movement.

The above stated method allows an entire surface of a wafer to be tracked optically and an electronically generated mask pattern to be adjusted on a real-time basis in accordance with any wafer movement. Thus, the present invention can perform microlithography without a conventional electromechanical alignment system or a photographic masking plate.

A primary object of the present invention is to provide a means for performing microlithography with an electronically generated mask pattern.

Another object of the present invention is to provide a means for optically performing an alignment of a projected pattern to a wafer (surface area).

Another object of the present invention is to provide a means for performing microlithography without the need for a photographic masking plate.

Another object of the present invention is to provide a means for performing microlithography without the need for an electromechanical alignment system.

DESCRIPTION OF THE DRAWINGS

FIG. 1 is a schematic representation of an electro-optical micropatterning apparatus.

DETAILED DESCRIPTION OF THE PRESENT INVENTION

An electro-optical apparatus 10 for micropatterning a surface 12 of a semiconductor wafer 14 is shown in FIG. 1. Before the micropatterning process begins, the surface 12 of the semiconductor wafer 14 is coated with a layer of photoresist and a grid pattern of alignment fiducials is applied on top of this photoresist layer. This photoresist coated semiconductor wafer is then placed on a moveable X-Y stage 11 for micropatterning by the apparatus 10.

In the present invention, an argon-ion laser 16, or some other monochromatic source of suitably short wavelength (250 nm to 450 nm), outputs a polarized monochromatic light beam 18. This beam 18 is expanded and collimated by a collimator 20 and reflectively directed by a first polarizing beam splitter (PBS) 22 through a quarter wave plate (QWP) 24 to a face 27 of a liquid crystal light valve (LCLV) 26. The LCLV 26 is optically connected to a screen 29 of a cathode ray tube (CRT) 30 by a fiber optic faceplate 28. The CRT 30 is controlled by a computer 50. Thus, as the computer 50 controls a display of an image on the CRT screen 29, a reflective pattern of this image is produced on the face of the LCLV 27. This reflective pattern serves as a lithographic mask and is used to micropattern the photoresist coated surface 12 of the semiconductor wafer 14. It should be noted that, for purposes of this description, the computer 50 includes a CRT driver circuit and a charge coupled device (CCD) camera digitizer circuit in addition to a computer.

A portion 32 of the collimated monochromatic light beam is reflected from the face of the LCLV 27 and returned through the QWP 24, thereby obtaining the proper polarization so as to pass through the first PBS 22 and also through a second PBS 34. This beam 32 is demagnified through a lens system 36 and an image of the lithographic mask pattern is formed on a projected area 37 of the wafer surface 12. Thus, the projected area 37 of the photoresist coated wafer surface 12 is exposed with an image of the lithographic mask pattern.

A helium-neon laser 38, or some other monochromatic light source of suitably long wavelength (e.g. 550 nm to 650 nm) so as not to expose photoresist, outputs a polarized monochromatic light beam 44. This beam 44 is expanded and collimated by a collimator 40 and proportionally reflected by a non-polarizing beam splitter (BS) 42 toward the second PBS 34. The BS 42 induces an optical loss in the polarized and collimated helium-neon beam 46 due to a proportional reflective and transmissive quality that is inherent in non-polarizing beam splitters. The second PBS 34 reflectively directs a BS reflected portion 33 of the collimated helium-neon beam 46 onto the surface 12 of the semiconductor wafer 14. This reflectively directed beam 35 is demagnified through the same lens system 36 that also demagnified the argon-ion beam 32. Therefore, both of these beams 32, 35, are projected upon the same area 37 of the wafer surface 12. Since the wavelength of the helium-neon beam is such that no exposure occurs to the photoresist coated wafer surface 12, the entire projected surface area 37 of the wafer may be illuminated.

A polarized and collimated helium-neon beam 45 is reflected from the projected wafer surface area 37 and reflectively directed by the second PBS 34 to the BS 42. This reflectively directed helium-neon beam 47 is proportionally passed through the BS 42 onto an image plane 49 of a CCD camera 48, where an image of the projected surface area 37 is formed. The BS 42 again induces an inherent optical loss in the reflectively directed helium-neon beam 47, but the remaining beam intensity should be sufficient to allow a clear image of the projected surface area 37 to be formed on the CCD image plane 49. It should be noted, however, that if the losses inflicted by the BS 42 are deemed to be too large, a more efficient method of directing the helium-neon beams 46, 47 is available.

This alternate method of directing the helium-neon beams 46, 47 consists of replacing the BS 42 with a third PBS and tilting the helium-neon laser 38, collimator 40, and third PBS 42 assembly, presently shown in the Y-Z plane, at an angle of 45° along the negative X-axis coordinate. Also, a QWP is added in between the third PBS 42 and the second PBS 34 to provide a correct polarization for the reflected and transmitted helium-neon beams 46, 47 respectively. This method eliminates the inherent optical losses inflicted by the BS 42.

The CCD camera 48 captures the projected surface area image and the computer 50 digitizes this image to determine the present projected surface area position 37. The computer 50 makes the position determination by comparing the captured surface area image, including alignment fiducials, to an expected surface area position. If a discrepancy is found in the comparison process an alignment error exists. To correct an alignment error, the computer 50 updates the mask pattern display on the CRT screen 29, thereby making a real-time adjustment in the mask pattern image being exposed onto the projected area 37 of the photoresist coated wafer surface 12.

The above-stated method allows full wafer surface micropatterning by moving the position of the wafer 14 with respect to the projected argon-ion 32 and helium-neon 35 light beams, and adjusting the lithographic mask pattern in accordance this movement. That is, the X-Y stage 11 allows the position of the wafer 14 to be moved with respect to the stationary position of the argon-ion 32 and helium-neon 35 light beams. This wafer movement is detected by a computer comparison between the CCD camera 48 captured surface area position and an expected surface area position. The mask pattern display on CRT screen 29 is then updated by the computer 50 in accordance with the detected movement. Lastly, the argon-ion beam 32 images the updated lithographic mask pattern onto the projected area 37 of the photoresist coated wafer surface 12.

It should be noted that a full wafer surface mask pattern and information regarding the expected surface area position is stored in the memory of computer 50.

Although not fully addressed in this description, it is also possible to have the position of the micropatterning apparatus 10 move with respect to a stationary wafer 14. However, this scheme is much more complex due to the larger burden of moving the bulky apparatus 10 as compared to the small wafer 14 and due to the difficulty in keeping the optical elements in the apparatus 10 precisely aligned while it is moving.

It is thus seen that the objects set forth above and those made apparent from the proceeding description are efficiently attained and, since certain changes may be made in the above apparatus without departing from the scope of the invention, it is intended that all matter contained in the above description or shown in the accompanying drawing shall be interpreted as illustrative and not in a limiting sense.

What is claimed is:

1. An apparatus for micropatterning a surface, said surface having a property that is sensitive to irradiation, said apparatus comprising:
   means for electronically generating a reflective pattern;
   means for irradiating said irradiation sensitive surface with a radiated image of said reflective pattern; and
   means for determining the position of said irradiation sensitive surface on which said radiated reflective pattern image is incident, such that said radiated reflective pattern image is properly aligned with said irradiation sensitive surface, and such that when the position of said irradiation sensitive surface moves with respect to said radiated reflective pattern image, said generated reflective pattern changes in accordance with said movement.

2. An apparatus as described in claim 1, wherein said means for generating a reflective pattern comprises:
   a cathode ray tube (CRT) for displaying a CRT displayed image;
   a liquid crystal light valve (LCLV) for forming a reflective pattern of said CRT displayed image;
   a fiber optic faceplate for optically connecting said CRT to said LCLV; and
   a computer, electrically connected to said CRT, for controlling said CRT displayed image.

3. An apparatus as described in claim 2, wherein said computer controls said CRT displayed image on a screen of said CRT, wherein said CRT displayed image is optically transferred by said fiber optic faceplate from said CRT screen to said LCLV, and wherein said reflective pattern of said CRT displayed image is formed on a face of said LCLV.

4. An apparatus as described in claim 3, wherein said reflective pattern of said CRT displayed image is used as a lithographic mask pattern for exposing a photoresist coated surface of a semiconductor wafer.

5. An apparatus as described in claim 1, wherein said means for irradiating comprises a means for irradiating with monochromatic light.

6. An apparatus as described in claim 5, wherein said means for irradiating with monochromatic light comprises:
   a source for providing a polarized monochromatic light beam;
   a collimator for collimating said polarized monochromatic light beam;
   a liquid crystal light value (LCLV) for forming said reflective pattern from which said collimated and polarized monochromatic light beam is reflected;
   a plurality of polarizing beam splitters for directing said collimated and polarized monochromatic light beam;
   a quarter wave plate (QWP) for changing the polarization of said collimated and polarized monochromatic light beam; and
   a lens system for focusing said collimated and polarized monochromatic light beam.

7. An apparatus as described in claim 6, wherein said reflected, collimated, and polarized monochromatic light beam is convergently focused onto said irradiation sensitive surface by said lens system.

8. An apparatus as described in claim 7, wherein an image of said reflective pattern is irradiated onto said irradiation sensitive surface by said convergently focused polarized monochromatic light beam.

9. An apparatus as described in claim 8, wherein said irradiation sensitive surface is a photoresist coated surface of a semiconductor wafer, and wherein said reflective pattern image is exposed onto said photoresist coated surface by said convergently focused polarized monochromatic light beam.

10. An apparatus as described in claim 6, wherein said source for providing a polarized monochromatic light beam is an argon-ion laser.

11. An apparatus as described in claim 1, wherein said means for determining the position of said irradiation sensitive surface comprises:
    a source for providing a polarized monochromatic light beam;
    a collimator for collimating said polarized monochromatic light beam;
    a plurality of beam splitters for directing said collimated and polarized monochromatic light beam;
    a lens system for providing a converging focus to said collimated and polarized monochromatic light beam;
    a means for capturing a radiated image of said irradiation sensitive surface; and
    a means for comparing said captured radiated surface image with an expected surface image.

12. An apparatus as described in claim 11, wherein said polarized monochromatic light beam is convergently focused onto said irradiation sensitive surface by said lens system, and wherein said polarized monochromatic light beam from said lens system is reflected from said surface and directed toward said means for capturing a radiated irradiation sensitive surface image.

13. An apparatus as described in claim 12, wherein said means for capturing a radiated surface image is a charge coupled device (CCD) camera.

14. An apparatus as described in claim 11, wherein said means for comparing said captured radiated surface image with said expected surface image is a computer.

15. An apparatus as described in claim 14, wherein said expected surface image is a computer stored expected image.

16. An apparatus as described in claim 14, wherein said computer also controls said means for generating a reflective pattern such that said reflective pattern is controlled to change in accordance with the determined position of said irradiation sensitive surface.

17. An apparatus as described in claim 11, wherein said irradiation sensitive surface is a photoresist coated semiconductor wafer surface, and wherein said polarized monochromatic light beam has a wavelength such that said photoresist is not exposed.

18. An apparatus as described in claim 17, wherein said source for providing a polarized monochromatic light beam is a helium-neon laser.

19. A method for micropatterning a surface, said surface having a property that is sensitive to irradiation, said method comprising the steps of
    electronically generating a pattern from which polarized monochromatic light may be reflected;
    irradiating said irradiation sensitive surface with polarized monochromatic light that is reflected from said electronically generated pattern so as to radiate an image of said electronically generated pattern;

determining the position of said irradiation sensitive surface with respect to said image of said electronically generated pattern; and updating said electronically generated pattern to correspond with said determined irradiation sensitive surface position, such that said electronically generated pattern changes in accordance with any determined position movement said irradiation sensitive surface.

20. A method as described in claim 19, wherein said step of generating a pattern includes the substeps of:

displaying an image on a screen of a cathode ray tube (CRT);

optically connecting said CRT screen to a liquid crystal light value (LCLV); and forming a reflective pattern of said CRT displayed image on a face of said LCLV.

21. A method as described in claim 19, wherein said step of irradiating said irradiation sensitive surface includes the substeps of:

providing a polarized monochromatic light beam;

collimating said polarized monochromatic light beam;

directing said collimated and polarized monochromatic light beam toward said electronically generated pattern;

reflecting said directed, collimated, and polarized monochromatic light beam from said electronically generated pattern;

directing said reflected, collimated, and polarized monochromatic light beam toward a lens system;

focusing said directed, reflected, collimated, and polarized monochromatic light beam onto said irradiation sensitive surface; and exposing an image of said electronically generated pattern onto said irradiation sensitive surface with said focused, directed, reflected, and polarized monochromatic light beam.

22. A method as described in claim 19, wherein said step of determining the position of said irradiation sensitive surface includes the substeps of:

providing a polarized monochromatic light beam;

collimating said polarized monochromatic light beam;

directing said collimated and polarized monochromatic light beam toward a lens system;

focusing said directed, collimated, and polarized monochromatic light beam onto said irradiation sensitive surface;

reflecting said directed, focused, and polarized monochromatic light beam from said irradiation sensitive surface;

collimating said reflected, focused, and polarized monochromatic light beam;

directing said collimated, reflected, and polarized monochromatic light beam toward a charge coupled device (CCD) camera;

capturing said image of said irradiation sensitive surface from said directed, collimated, reflected, and polarized monochromatic light beam by said CCD camera; and comparing said captured irradiation sensitive surface image to an expected surface image.

23. A method as described in claim 19, wherein said step of updating said generated pattern includes the substeps of:

determining an alignment of said radiated image of said electronically generated pattern with respect to said irradiation sensitive surface position by said step of determining the position of said light sensitive surface with respect to said polarized monochromatic radiation that radiates said electronically generated pattern image; and controlling a cathode ray tube (CRT) screen to display an updated image from which said pattern is electronically generated, wherein said electronically generated pattern is updated from said CRT displayed updated image, wherein an image of said updated pattern is radiated onto said irradiation sensitive surface by said polarized monochromatic radiation, and wherein said updated radiated pattern image is properly aligned onto said irradiation sensitive surface.

24. A method as described in claim 19, additionally including the step of applying a coating of photoresist onto said surface to enable said surface to be irradiation sensitive.

* * * * *